US006952431B1

(12) United States Patent
Dally et al.

(10) Patent No.: US 6,952,431 B1
(45) Date of Patent: Oct. 4, 2005

(54) CLOCK MULTIPLYING DELAY-LOCKED LOOP FOR DATA COMMUNICATIONS

(75) Inventors: William J. Dally, Stanford, CA (US); John W. Poulton, Chapel Hill, NC (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 09/557,640

(22) Filed: Apr. 25, 2000

Related U.S. Application Data

(60) Provisional application No. 60/161,977, filed on Oct. 28, 1999.

(51) Int. Cl.[7] .................................................. H04J 3/06
(52) U.S. Cl. ....................................... 370/516; 370/503
(58) Field of Search ................................ 370/516, 517, 370/518, 519, 503; 375/215; 331/18, 25, 331/48, 90; 327/161, 162, 156, 157, 155, 327/146, 147, 148

(56) References Cited

U.S. PATENT DOCUMENTS

| | | | |
|---|---|---|---|
| 4,626,796 A | 12/1986 | Elder | |
| 5,260,608 A | 11/1993 | Marbot | |
| 5,278,702 A | 1/1994 | Wilson et al. | |
| 5,361,254 A | 11/1994 | Storck et al. | |
| 5,432,481 A | 7/1995 | Saito | |
| 5,514,990 A | 5/1996 | Mukaine et al. | |
| 5,537,069 A * | 7/1996 | Volk | 327/149 |
| 5,646,564 A * | 7/1997 | Erickson et al. | 327/158 |
| 5,717,353 A * | 2/1998 | Fujimoto | 327/276 |
| 5,786,715 A | 7/1998 | Halepete | |
| 6,014,177 A | 1/2000 | Nozawa | |
| 6,037,812 A * | 3/2000 | Gaudet | 327/116 |
| 6,043,717 A * | 3/2000 | Kurd | 331/17 |
| 6,075,406 A | 6/2000 | Lee et al. | |
| 6,087,864 A | 7/2000 | Aoki | |
| 6,097,777 A | 8/2000 | Tateishi et al. | |
| 6,114,915 A | 9/2000 | Huang et al. | |
| 6,208,183 B1 * | 3/2001 | Li et al. | 327/161 |
| 6,211,742 B1 | 4/2001 | Tan et al. | |
| 6,259,755 B1 | 7/2001 | O'Sullivan et al. | |
| 6,275,072 B1 * | 8/2001 | Dally et al. | 327/7 |
| 6,285,225 B1 * | 9/2001 | Chu et al. | 327/158 |
| 2001/0015663 A1 | 8/2001 | Dally et al. | |

OTHER PUBLICATIONS

Dally, William J. and Poulton, John W., *Digital Systems Engineering*, Cambridge University Press, 1998, pp. 428-447, 537-540 and 547-548.

Kim, Weigant and Gray, "PLL/DLL System Noise Analysis for Low Jitter Clock Synthesizer Design," ISCAS, 1994, pp. 31-34.

Waizman, A., "A Delay Line Loop for Frequency Synthesis of De-Skewed Clock," IEEE International Solid-State Circuits Conference, 1994, pp. 298-299.

(Continued)

*Primary Examiner*—Duc Ho
*Assistant Examiner*—Thien Tran
(74) *Attorney, Agent, or Firm*—Hamilton, Brook, Smith & Reynolds, P.C.

(57) ABSTRACT

In a communications system, data is multiplexed onto a transmission medium at a transmitter and demultiplexed from the transmission medium at a receiver. The clock applied to the transmitter and receiver is a multiplying delay-locked loop in which a delay line provides a multiplied clock which is applied back to its input. A delay adjustment circuit including a proportional phase comparator of low offset adjusts delay in the delay line.

29 Claims, 18 Drawing Sheets

OTHER PUBLICATIONS

Dally, William J. and Poulton, John W., "Transmitter Equalization for 4Gb/s Signaling," IEEE Micro, Jan-Feb 1997, pp. 48-56.

Dally, William J. and Poulton, John W., *Digital Systems Engineering,* Cambridge University Press, 1998, pp. 459-460, 615-620 and 626-627.

* cited by examiner

CLOCK MULTIPLYING DELAY-LOCKED LOOP FOR DATA COMMUNICATIONS

RELATED APPLICATION(S)

This application claims the benefit of U.S. Provisional Application No. 60/161,977, filed Oct. 28, 1999, the entire teachings of which are incorporated herein by reference.

BACKGROUND OF THE INVENTION

High-speed data communication systems commonly use multiplexing transmitters and demultiplexing receivers. In such a system, as illustrated in FIG. 1, transmit data arrives on a set of parallel lines 113 and is multiplexed onto the transmission line 114. The multiplexer converts the parallel signal at the reference clock rate on lines 113 into a serial signal at the bit clock rate on line 114. At the other end of the link, the serial signal arrives on input line 115 and is demultiplexed onto parallel outputs 116. In such a system, the bit clock that sequences multiplexer 102 and demultiplexer 103 has a frequency that is a multiple of the reference clock 111 used to clock parallel input 113 and parallel output 116. In the example of FIG. 1 where the multiplexing rate is 4:1, the bit clock would be at four times the frequency of the reference clock. In actual systems, a ratio of 10:1 or 20:1 is typical.

Phase-locked loop clock multipliers have been used to multiply the frequency of the reference clock to generate the bit clock. In FIG. 1 clock 111 is input to clock multiplier 101 which multiplies the clock frequency to generate bit clock 112. Bit clock 112 is then used by multiplexer 102 to multiplex parallel input 113 onto the input of driver 104 which drives the multiplexed data onto output line 114. The bit clock is also used by demultiplexer 105 to separate the multiplexed input stream on input line 115 onto parallel outputs 116.

FIG. 2 illustrates a prior art phase-locked loop clock multiplier. The bit clock, bclk is generated by voltage-controlled oscillator 121. This clock is then divided down to the reference clock rate by a divide-by-N counter 122. The divided clock, dclk, is then compared to the input reference clock, rclk, by phase comparator 123. The phase comparator signals the phase difference between rclk and dclk to the charge pump and loop filter 124 which adjusts the control voltage of the VCO to bring rclk and dclk into phase. Further details of phase-locked loops are described in Dally and Poulton, *Digital Systems Engineering*, Cambridge, 1998, pp 441–447.

An alternative prior art multiplexing data communication system that uses a multi-phase clock rather than a clock multiplier is illustrated in FIG. 3. In the figure a four-phase clock, p1–p4, is used to multiplex parallel lines 113 onto output line 114 and to demultiplex serial input 115 onto parallel lines 116. The four-phase clock is generated by a delay-locked loop (DLL) comprising tapped delay line 131, phase comparator 123, and charge pump 124. The tapped delay line is itself composed of four delay elements 132–135. Phase comparator 123 compares the output of the delay line, p4, with the reference clock and signals the charge pump to adjust the control voltage, vctrl, of the delay line to bring p4 and rclk into phase. When the loop has converged, vctrl is set at a value that causes delay line 131 to have a delay of exactly one reference clock cycle. To the extent that delay elements 132–135 are matched, the four phases are equally spaced with one bit-time of delay between each phase. In the multiplexer, the rising edge of each phase sequences the corresponding bit onto the line, and in the demultiplexer the rising edge of each phase samples the value on the line onto the corresponding parallel output. Further details of delay-locked loops are described in Dally and Poulton, *Digital Systems Engineering*, Cambridge, 1998, pp 428–441, and details of multiplexing data communication systems using DLLs are described in pp. 537–540 and 547–548 of the same reference.

Prior art data communication systems based on PLL clock multipliers and multi-phase DLLs have large amounts of jitter due to the method used to generate timing signals. Phase-locked loop based clock multipliers have large amounts of jitter because the phase error at the end of each cycle accumulates until the control loop can respond. As described in Kim, Weigant, and Gray, "PLL/DLL System Noise Analysis for Low Jitter Clock Synthesizer Design," *ISCAS* 1994, pp. 31–38, this error accumulation multiplies the jitter of the basic delay elements by a factor that is inversely proportional to the loop bandwidth. For typical phase-locked loops, the jitter is multiplied by a factor of at least 10.

Communication systems based on multi-phase delay-locked loops do not accumulate jitter from cycle-to-cycle like PLL clock multipliers. However, they do introduce jitter due to cumulative phase mismatches. Due to device mismatches in the delay elements, there is a variation in the delay of each stage of the delay line. These phase mismatches accumulate over the length of the delay line leading to large jitter values, particularly when the multiplexing rate is high.

SUMMARY OF THE INVENTION

The present invention relates to a data communications circuit (i.e., a transmitter, receiver or transceiver) for multiplexing data on a transmission medium. A multiplexing circuit (i.e., a multiplexer or demultiplexer) is clocked by a multiplying delay locked loop. More specifically, a clock multiplier comprises a delay line which provides a multiplied clock applied back to the input of the delay line. A delay adjustment circuit including a phase comparator adjusts delay in the delay line based on a phase comparison of a reference clock and a multiplied clock.

A novel multiplying delay locked loop particularly suited to the data communications circuit of the present invention comprises a delay line which provides a multiplied clock. A clock multiplexer applies as an input to the delay line, at respective times, the multiplied clock and a reference clock. A delay adjustment circuit includes a proportional phase comparator to adjust delay in the delay line based on the phase comparison of the reference clock and of the multiplied clock.

Preferably, the phase comparator has a low phase offset of less than five percent of a bit time and/or less than ten percent of a gate delay. One implementation has an offset of less than 4 picoseconds, less than one percent bit time, and less than four percent gate delay. The preferred delay adjustment circuit includes a combined phase comparator and a charge pump.

The present invention overcomes the jitter problems of prior art data communication systems based on PLLs and multi-phase DLLs. Unlike a PLL, the multiplying DLL of the present invention does not accumulate phase error from cycle to cycle of the reference clock. The phase error is reset to zero on each rising edge of the reference clock. Thus, for a given amount of phase noise in the basic delay elements, the multiplying DLL of the present invention has an order of magnitude less phase noise than a PLL. The present invention avoids the jitter problems due to mismatch between the delay elements in a multi-phase DLL because it uses only a single delay element to generate all of the bit-to-bit timing intervals.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 3:
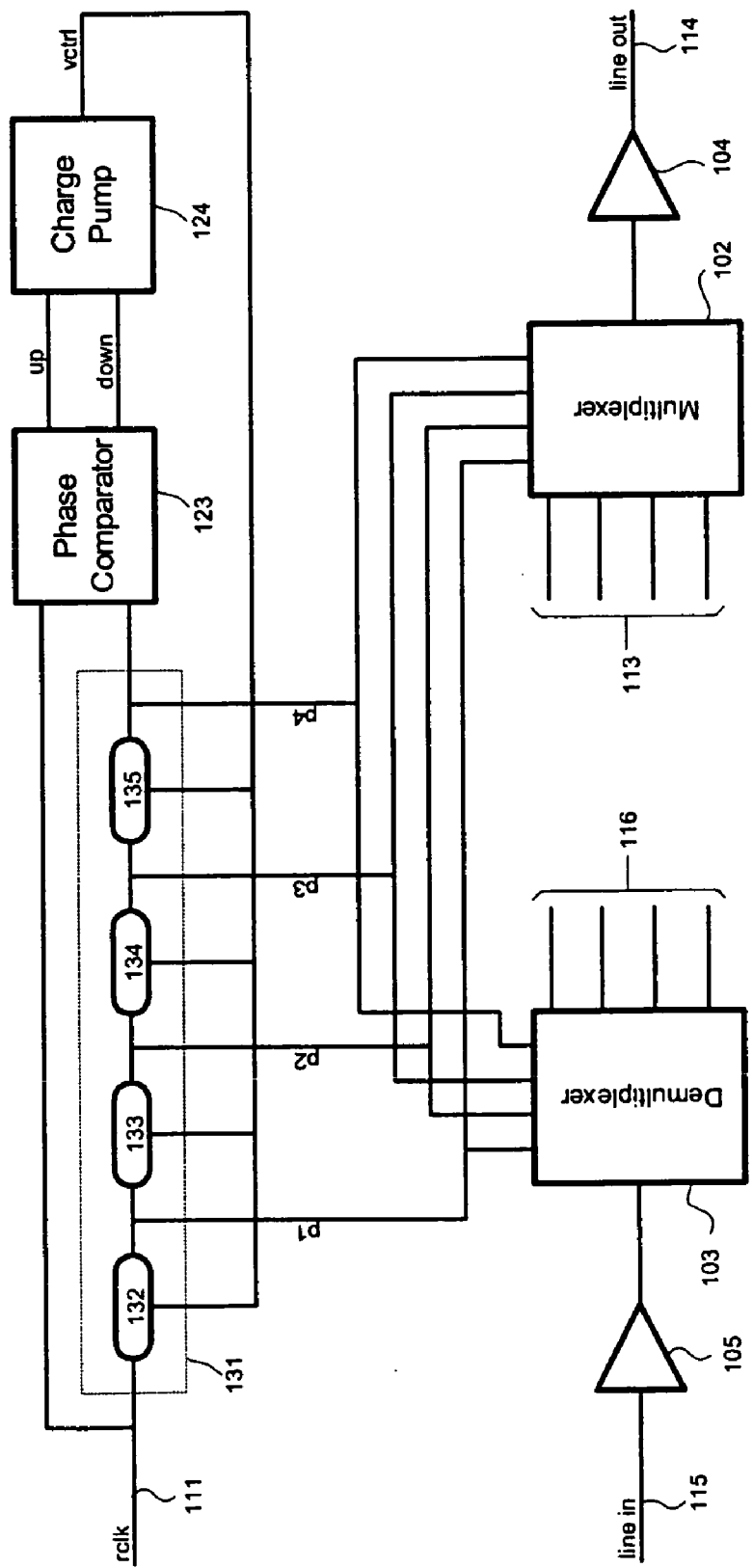
FIG. 3 illustrates a prior art multiphase clock used as an alternative to the clock multiplier of FIG. 2.
Figure 4:
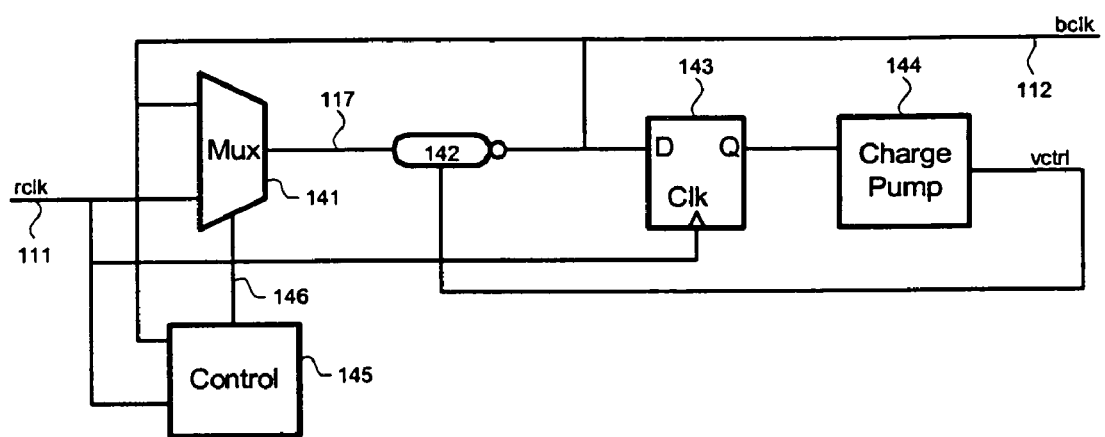
FIG. 4 illustrates a multiplying delay-locked loop previously used in microprocessor clock circuits.

A clock-multiplying delay-locked loop previously used as a microprocessor clock is illustrated in FIG. 4. Like the PLL of FIG. 2, this loop multiplies the frequency of the reference clock but with loop dynamics that correspond to the DLL of FIG. 3. As shown in FIG. 4, reference clock 111 is input to multiplexer 141, the output of which drives delay line 142 to generate the bit clock (bclk) 112. The bit clock 112 is recirculated back to multiplexer 141 and passed to the delay line 142. The delay through delay line 142 determines the duration of a bclk pulse, and with bclk fed back to the input of the delay line, a ring oscillator is formed to generate multiple bclk pulses for each rclk pulse.

In operation, control block 145 sets multiplexer control line 146 to select the reference clock as input to the delay line. Then, after a rising edge on the reference clock, control block 145 switches line 146 to recirculate the bit clock 112, effectively forming the ring oscillator. After N-1 rising edges on the bit clock, control switches back to select the reference clock to apply a single rising edge to the delay line. The delay flip flop 143 serves as a phase comparator to provide a delay control signal vctrl through a charge pump 144. Adjustment of the delay serves to phase synchronize blck with the rising edge of rclk, the frequency of bclk being a multiple of the frequency of rclk.

Multiplying delay-locked loops have been used to multiply and deskew clocks in microprocessors as described in A Waizman, "A Delay Line Loop for Frequency Synthesis of De-Skewed Clock," *IEEE International Solid-State Circuits Conference*, 1994, pp 298–299.

Multiplying DLLs have not been used in data communication systems to date. A conventional multiplying DLL is not well-suited to data communications due to the fact that it has high jitter, the phase difference between earliest and latest edges of a cycle, due to two factors. First, the flip-flop 144 is a 'bang-bang' phase comparator that leads to considerable jitter when the loop is locked. This jitter is due to dithering of the control voltage to the delay element about the correct voltage. Second, and most importantly, because the prior multiplying DLL does not precisely align the rising edges of the bit clock and the reference clock, there is a considerable phase offset that appears as jitter during the cycle that the clock multiplexer switches to select the reference clock as input (last cycle mismatch).

Figure 19:
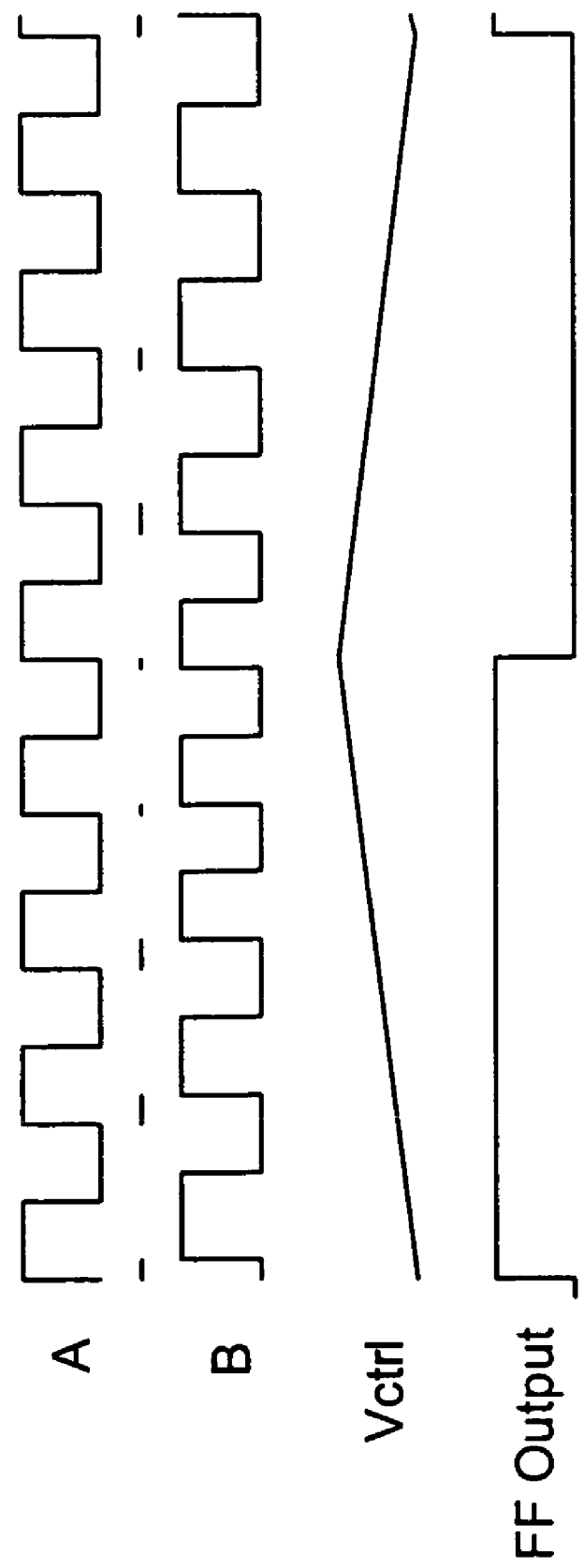
FIG. 19 illustrates jitter introduced by a bang-bang phase comparator in the circuit of FIG. 4.

The waveforms of FIG. 19 illustrate how a bang-bang phase comparator introduces jitter due to dithering of the control voltage. In this figure, the phase comparator output is shown on the bottom waveform. At each point of comparison, once every four cycles, the phase comparator output toggles. The loop filter or charge pump integrates this waveform, giving a triangle waveform on Vctrl. This sawtooth oscillation in Vctrl leads the output of the delay line, labeled B, to start out too slow, relative to the desired bclk signal A, then become too fast, and then become too slow again as Vctrl oscillates up and down about its correct value. In contrast, when a loop employing a proportional phase comparator of this invention is locked, Vctrl maintains a constant voltage without the up and down dither shown here.

Figure 20:
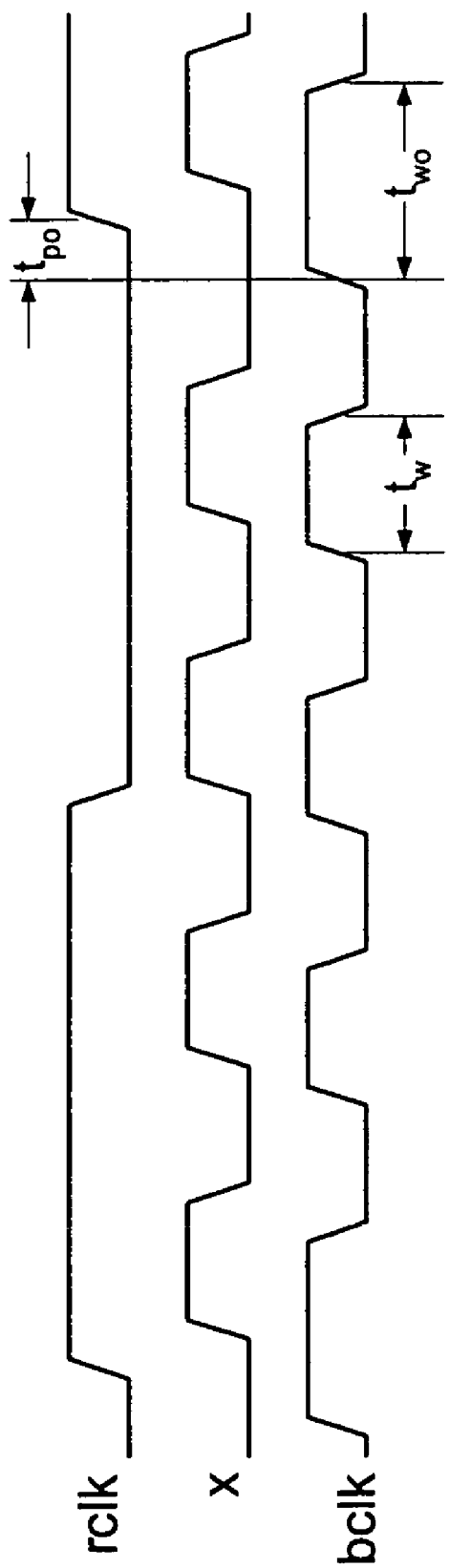
FIG. 20 illustrates jitter introduced by phase comparator offset in the circuit of FIG. 4.

The waveforms of FIG. 20 illustrate the effect of phase comparator offset on systematic jitter in a multiplying DLL. The waveforms show the situation where the phase comparator has an offset of $t_{po}$. That is, when the loop is locked, bclk leads rclk by $t_{po}$. Because of this offset, one cycle out of every four cycles is extended with pulse width $t_{wo}=t_w+t_{po}$. The imbalance in pulse widths causes a systematic jitter with peak to peak magnitude of $t_{po}$.

Figure 5:
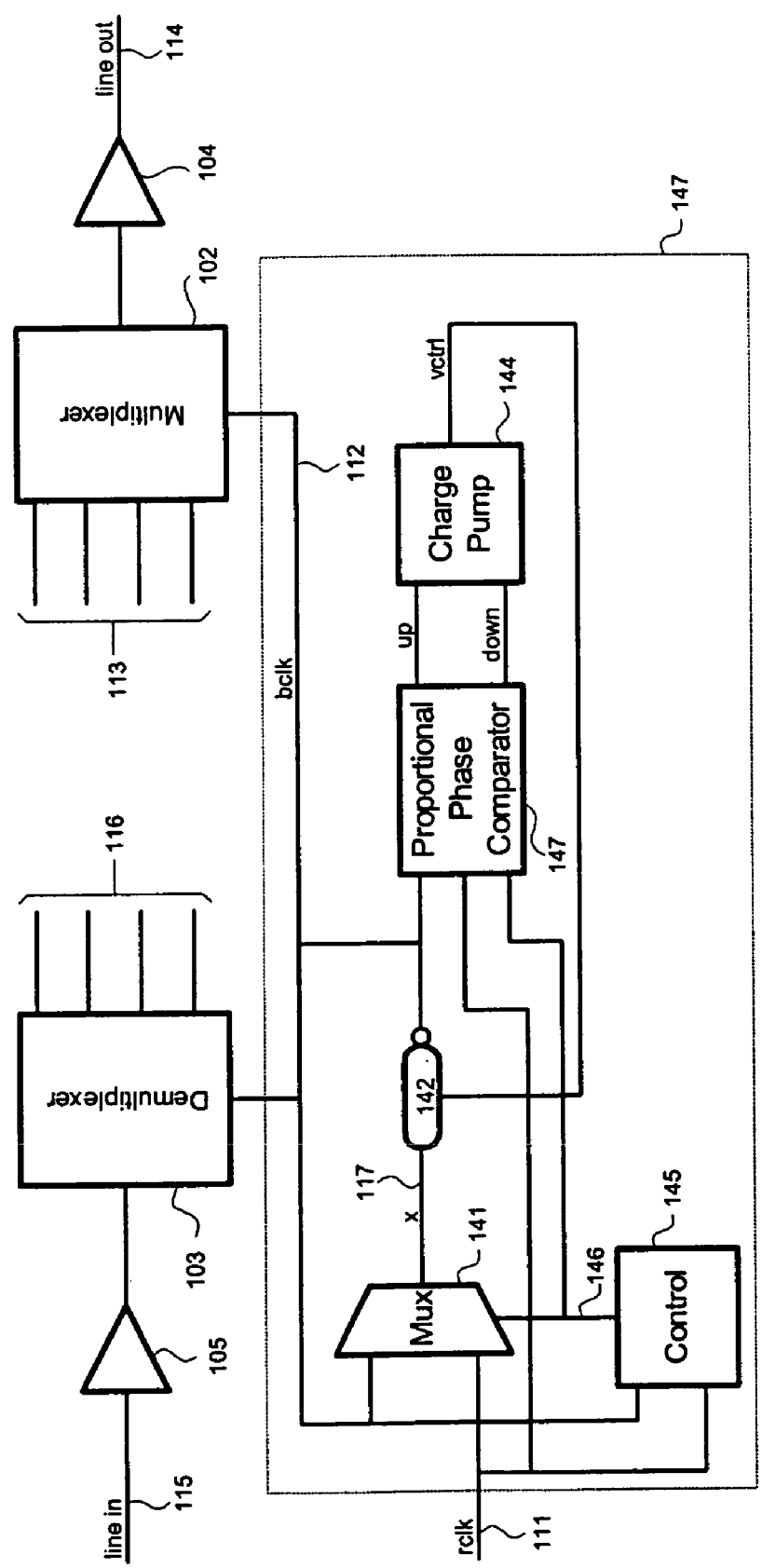
FIG. 5 illustrates a transceiver like that of FIG. 1 including a novel multiplying DLL embodying the present invention.

The present invention overcomes the high jitter of prior art data communication timing circuits by using a multiplying DLL with a low-offset, proportional phase comparator to eliminate both the dither and the 'last-cycle' mismatch. A block diagram of the present invention is shown in FIG. 5. The improved multiplying DLL 147 generates bit clock 112 to sequence data multiplexer 102 and data demultiplexer 103. The use of a proportional phase comparator 147 overcomes the dither of prior art multiplying DLLs by eliminating the oscillation of the control voltage about its proper value. A very low-offset phase comparator that directly compares rclk to bclk eliminates the 'last-cycle' mismatch inherent in prior-art multiplying DLLs. The preferred embodiment uses a low-offset combined phase comparator and charge pump, as described in U.S. patent application Ser. No. 09/414,761 filed Oct. 7, 1999, now U.S. Pat. No. 6,275,072, issued Aug. 14, 2001 to Dally et al. for Combined Phase Comparator and Charge Pump Circuit, to realize both phase comparator 147 and charge pump 144.

Figure 7:
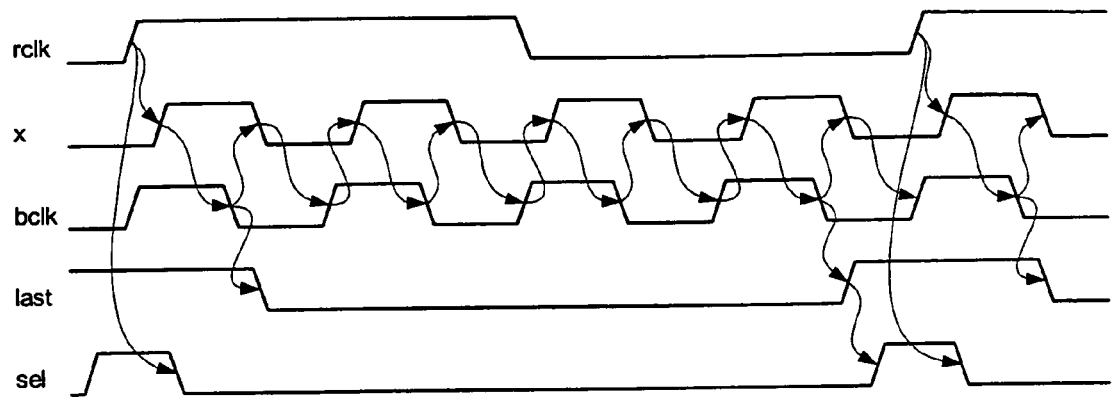
FIG. 7 presents waveforms illustrating operation of the multiplying DLL of FIG. 5.
Figure 8:
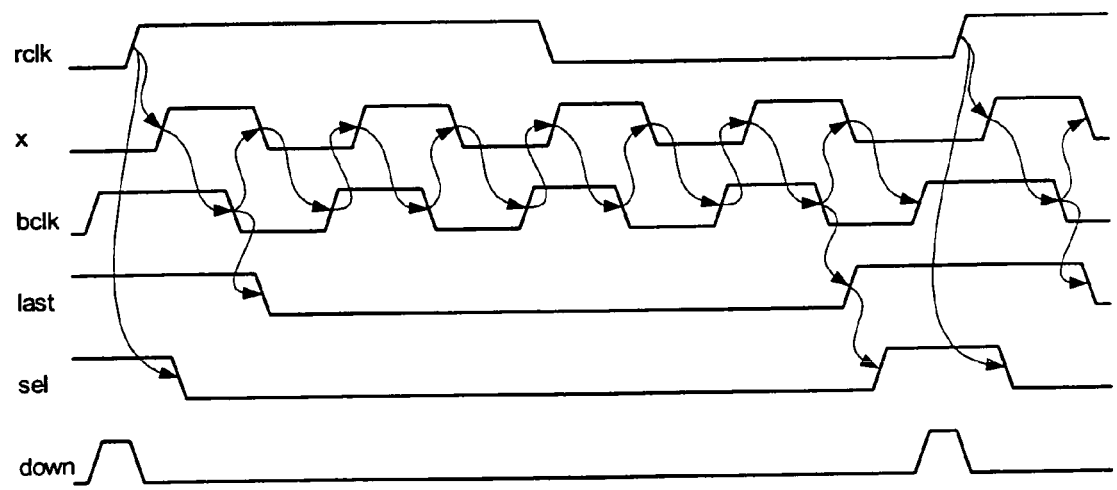
FIG. 8 presents waveforms similar to those of FIG. 7 where the bit clock is too fast.
Figure 9:
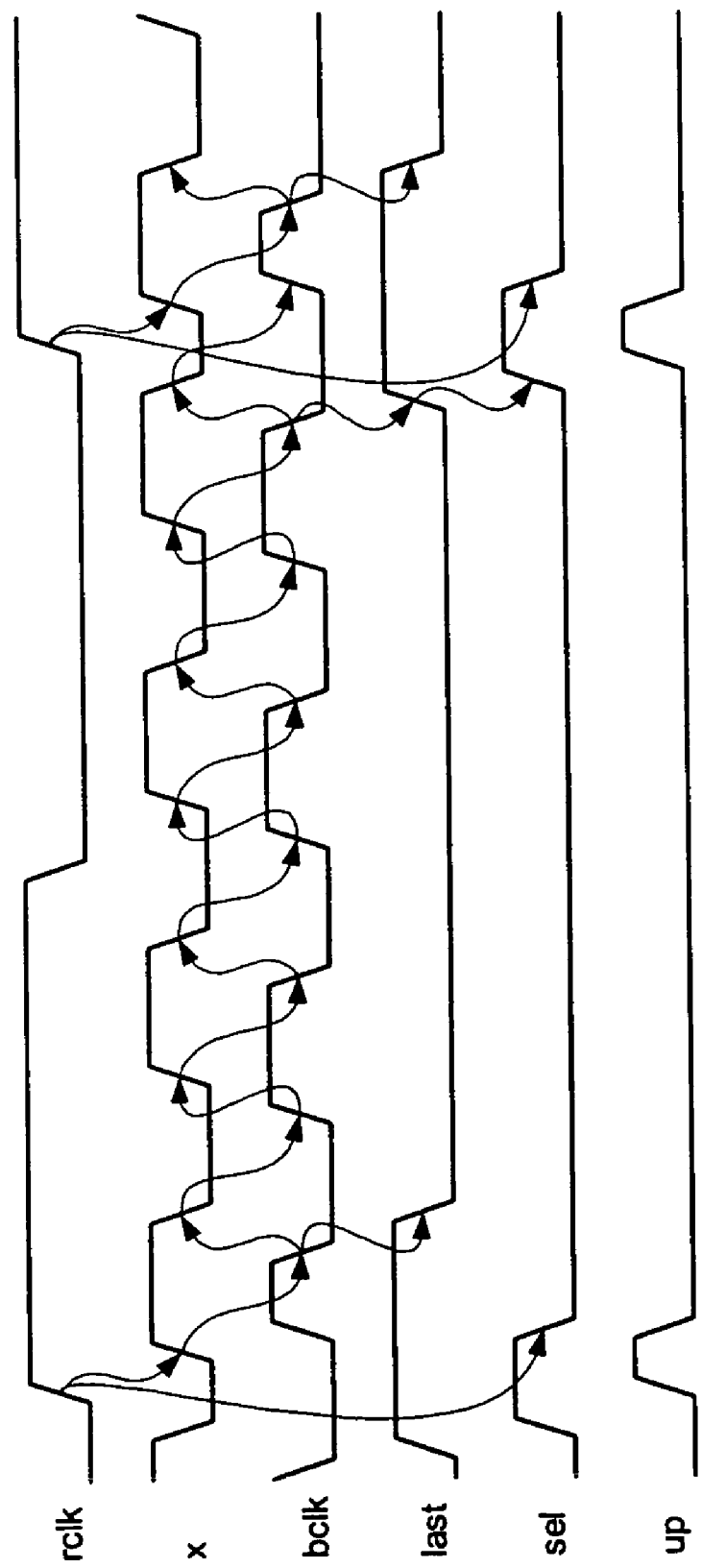
FIG. 9 presents waveforms similar to those of FIG. 7 where the bit clock is too slow.

A block diagram of a data transmission system of the present invention using the multiplying delay-locked loop is shown in FIG. 5. Timing diagrams showing operation of this circuit are shown in FIGS. 7 through 9. Control logic 145 generates a select signal, sel 146, that when asserted causes multiplexer 141 to select the reference clock, rclk 111, as input to delay line 142. As described below, the select signal is asserted during a one-bit-clock window of time about the rising edge of rclk. Thus each rising edge of rclk 111 is selected by multiplexer 141 and injected onto signal x 117, the input of delay line 142. After both bclk and rclk have risen, the select signal 146 is deasserted causing multiplexer 141 to select bclk 112, the output of delay line 142. In this state with select low, delay line 142 and multiplexer 141 are connected as a ring oscillator causing bclk to toggle with high and low periods set by the delay of delay line 142.

Proportional phase comparator 147 directly compares the phase of reference clock rclk 111 and bit clock bclk 112 and generates signals up and down which are proportional to the amount of phase difference. These signals cause charge pump 144 to adjust the level of vctrl which in turn controls the delay of the delay line. In the preferred embodiment this is done by using the select signal 146 as a window signal to a combined phase comparator and charge pump of the type described in patent application Ser. No. 09/414,761, now U.S. Pat. No. 6,275,072. Signals rclk and bclk are only examined by the phase comparator when window signal sel 146 is high. When rclk rises before bclk during the timing window when sel is asserted, the delay line is too slow. Thus, the phase comparator causes signal up to be asserted when rclk=1, bclk=0, and sel=1. This causes vctrl to be increased, speeding up the delay line and bringing rclk and bclk into alignment. Similarly, if bclk rises before rclk when sel is asserted, the delay line is too fast. To correct for this case, the phase comparator asserts signal down when rclk=0, bclk=1, and sel=1. This causes vctrl to be reduced, slowing the delay line and bringing rclk and bclk into alignment.

One skilled in the art will understand that the present invention can be realized with other phase comparators. For example, one may use a phase comparator that is not combined with a charge pump. Also, one may use a flip-flop phase comparator as in FIG. 4, exclusive-or phase comparator, or a sequential proportional phase comparator. However, the proportional phase comparator is greatly preferred over a bang-bang type comparator as in FIG. 4. To reduce the dither in the latter circuit, either the difference in voltage output from the flip flop 143 would have to be substantially reduced or the time constant of the charge pump 144 would have to be extended to such an extent that the system would be very slow in correcting phase shifts. With a proportional phase comparator, when the phase difference is large, a large feedback voltage vctrl may be applied to the delay element 142 to rapidly correct the phase difference; yet, with the system locked in phase, there is little dither due to oscillations of the phase comparator output.

Figure 1:
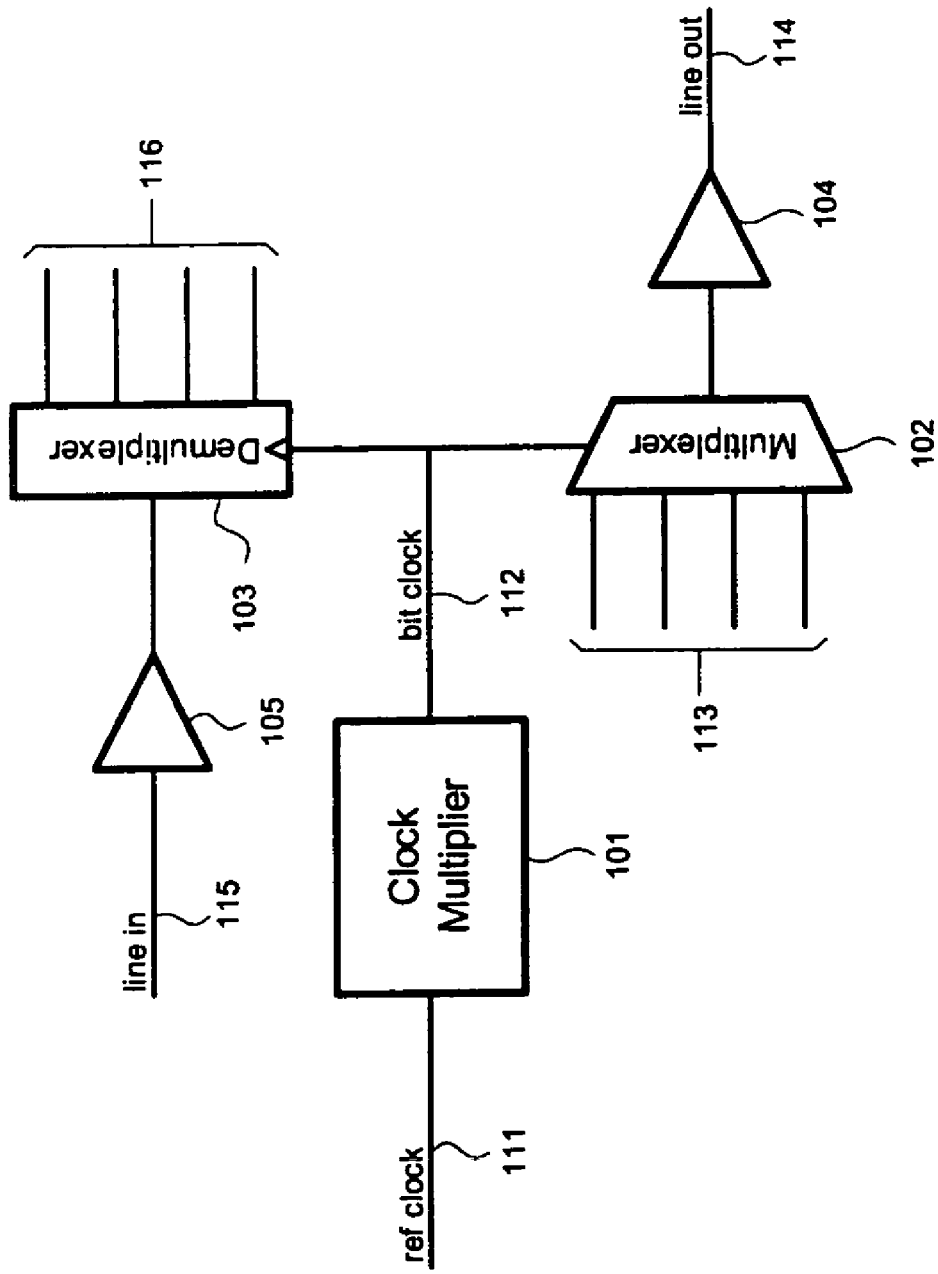
FIG. 1 illustrates a prior art data communications transceiver to which the present invention is applied.
Figure 2:
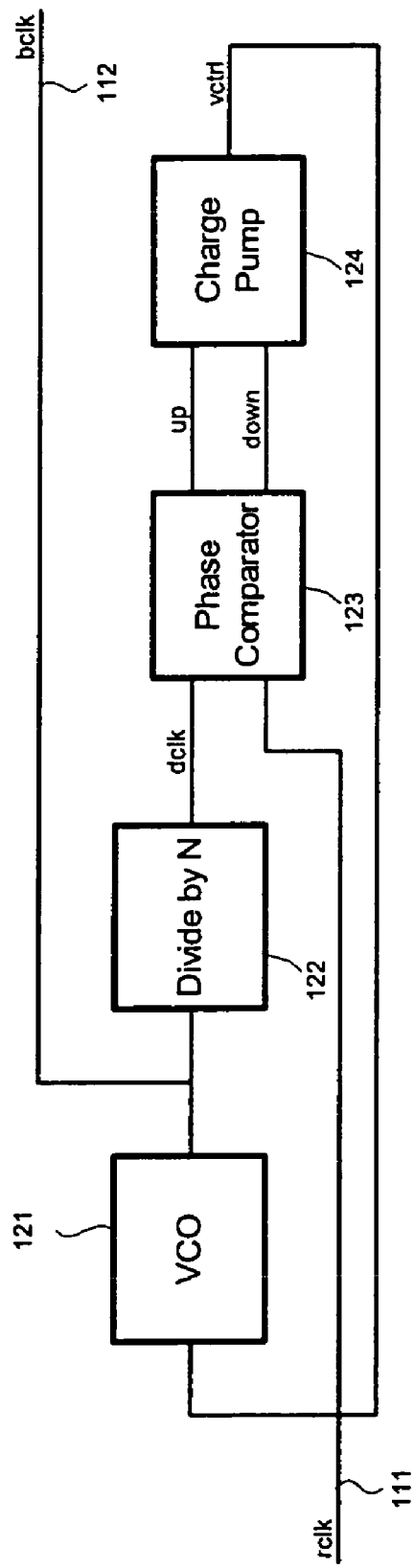
FIG. 2 illustrates a prior art phase locked loop used in the clock multiplier of FIG. 1.

To generate a bit clock with very low jitter, it is important that phase comparator 147 directly compare rclk 111 with bclk 112 and not with dclk, the output of a divider, as in FIG. 2. If rclk were compared with a derived signal dclk, the loop would align rclk with dclk, and rclk would be offset from bclk by the delay between bclk and dclk, usually a clock-to-out delay of a flip-flop. If bclk and rclk are offset in this manner, each time the multiplexer selects rclk as an input, bclk would jitter by the amount of the offset. This amount of jitter is unacceptable. Thus, the multiplying delay-locked loop will only work well with a phase comparator that is able to directly compare bclk with rclk, two signals at different frequencies.

Figure 6:
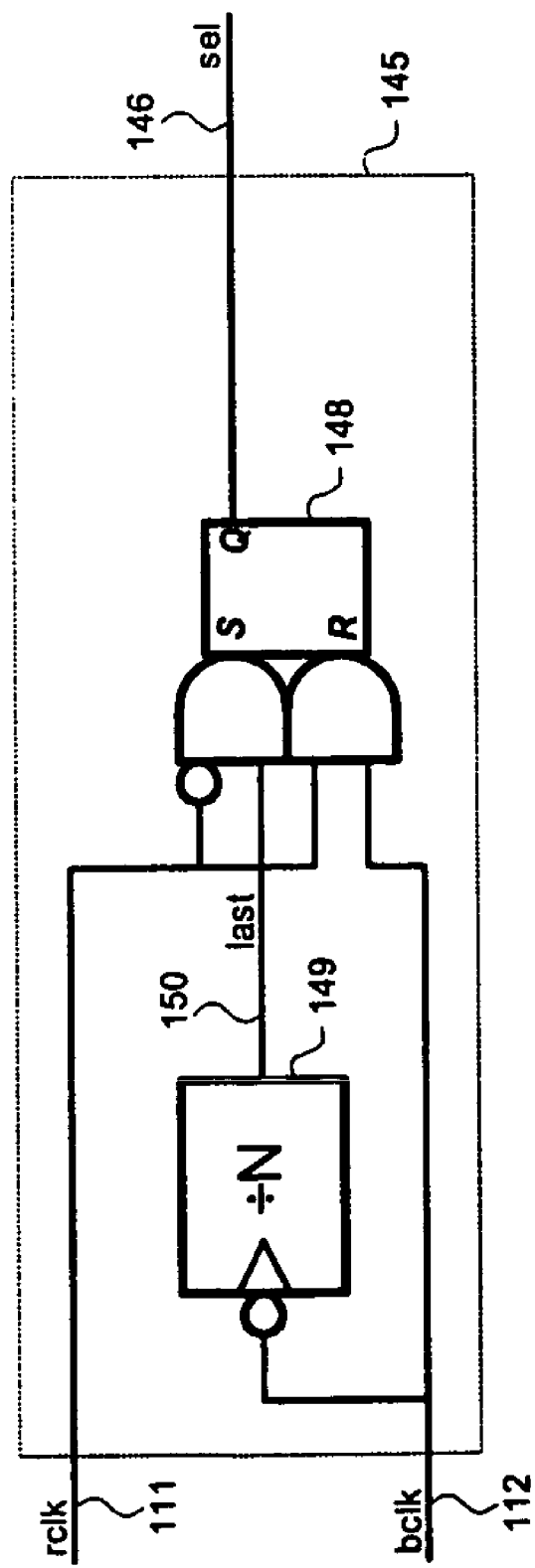
FIG. 6 illustrates control logic used in the embodiment of FIG. 5.

Detail of control logic 145 that generates multiplexer select signal 146 is illustrated in FIG. 6. Bit clock 112 is input to divide by N counter 149. This counter generates a pulse on the last signal 150 which in turn sets RS flip-flop 148 and in turn sets the select signal 146, causing multiplexer 141 to pass rclk 111. Setting of flip-flop 148 is inhibited when rclk 111 is high to prevent the select signal from being asserted before the rising edge of rclk during system initialization. After both rclk 111 and bclk 112 have risen, RS flip-flop 148 is reset returning the select signal 146 to the zero state causing the multiplexer to pass bclk 112.

Figure 11:
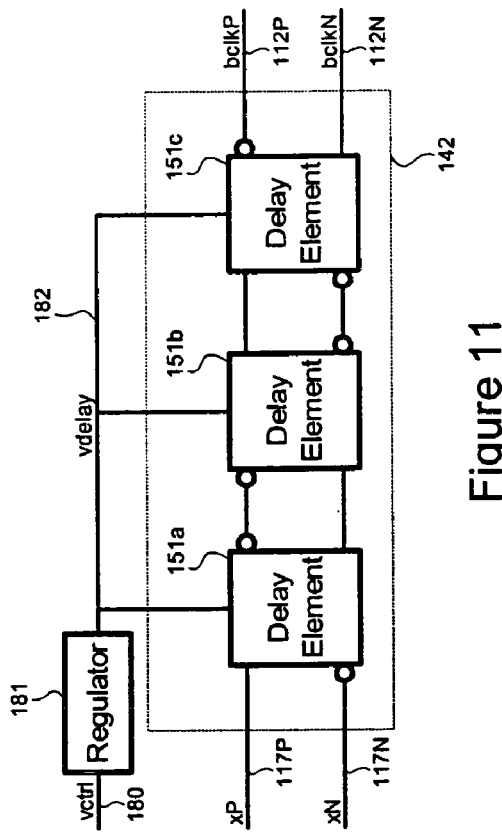
FIG. 11 presents a block diagram of the delay line of FIG. 5.

In the preferred embodiment, delay line 142 is realized with a differential inverter delay line controlled by a current regulator as described in pending patent application Ser. No. 09/453,368 filed Dec. 7, 1999 by Dally et al. for Low-Power Low-Jitter Variable Delay Timing Circuit. A block diagram of the delay line is shown in FIG. 11. Signal x 117 is input in differential form (with xP being the positive side of the signal and xN the negative side) to a series of three differential inverter delay elements 151a to 151c. The output of the last delay element is bclk 112, also in differential form. Regulator 181 in response to the control voltage, vctrl 180, from charge pump 144 generates the supply voltage to each delay element, vdelay 182.

Figure 10:
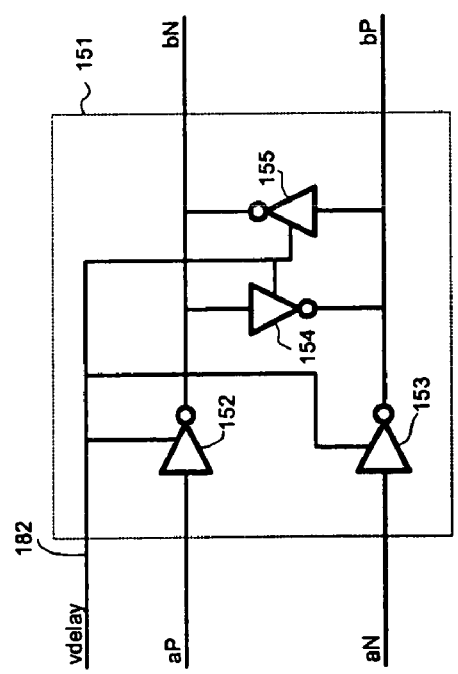
FIG. 10 presents a block diagram of an individual delay element used in the delay line of FIG. 5.

A block diagram of an individual delay element 151 is shown in FIG. 10. Signal aP,aN is input to a set of delay inverters 152 and 153 to generate output bP,bN. The delay of the inverters is controlled by voltage vdelay 182. The element takes advantage of the relationship between supply voltage and delay for a CMOS inverter. Thus, when vdelay is high the delay element has a low delay and when vdelay is low the delay element has a high delay. Over the operating range, the delay of the element is roughly proportional to $1/(Vctrl-Vt)$ where Vt is the threshold voltage of the process. Delay element 151 also employs two cross-coupled inverters 154 and 155. These inverters are sized to make them very weak and act to reduce skew between the two polarities of the differential signal.

Waveforms illustrating operation of the multiplying DLL of the present invention when the loop has converged are shown in FIG. 7. The figure illustrates the case where the multiplying rate, N=4. Arrows illustrate the dependence between signals. At the left side of the figure, multiplexer select signal, sel, goes high, allowing the rising edge of reference clock, rclk, to pass to multiplexer output, x. A short time later, sel is reset selecting the bclk input of multiplexer 141. After the delay of delay line 142, bit clock, bclk, goes low. The falling edge of bclk in turn causes signal x to fall which causes bclk to rise and so on. This oscillation of the bclk signal continues until the fourth falling edge of bclk causes counter output, last, to rise which in turn sets the select signal. Thus every fourth falling edge of bclk derives from the rising edge of rclk while the other three falling edges of bclk are triggered from the previous falling edge of bclk. Every rising edge of bclk is triggered by the preceding rising edge of bclk.

The waveforms shown in FIG. 8 illustrate the case where the control voltage is too high, and hence the delay of delay line 142 is too short and the bit clock is too fast. In this case operation proceeds as with FIG. 7 until the fourth falling edge of bclk causes last to go high which in turn causes sel to go high. Signal sel doubles as a multiplexer control and as a window signal for the phase comparator to compare rclk and bclk. When bclk rises while rclk is low and sel is high, the phase comparator generates a down pulse from the rising edge of bclk to the rising edge of rclk. This pulse acts to reduce the control voltage and hence slow delay line 142 to bring rclk and bclk into phase.

Because sel is high from the fourth falling edge of bclk to the time rclk rises, the multiplexer selects rclk as input to the delay line during this period. The bclk pulse is stretched until rclk rises which causes sel to fall, x to rise, and bclk to fall after the delay of the delay line. The net result is that when the delay line is too fast, every fourth pulse on bclk is stretched. This stretching allows bclk to catch up with the reference clock every rclk cycle. Thus, no phase error is accumulated from one rclk cycle to the next.

The circuit will operate properly regardless of how fast the delay line is (as long as the divide by N counter and the select flip-flop can keep up with the fast bit clock). The down pulse will simply last from the fourth rising edge of bclk to the rising edge of rclk. Note that if the delay line is very fast, last may rise before rclk falls. In this case, the logic of FIG. 6 inhibits sel until rclk falls to prevent the multiplexer from selecting rclk while it is still high and thus triggering a false edge on bclk.

FIG. 9 illustrates the case where the control voltage is low, the delay line is slow, and hence the bit clock is too slow. Operation proceeds as in FIGS. 7 and 8 until the fourth falling edge of bclk triggers last high and sel high. In this case, rclk rises while sel is high and bclk is low. This causes the phase comparator to assert the signal up from the rising edge of rclk to the rising edge of bclk. The up signal causes the charge pump to increase the control voltage which decreases the delay of the delay line and aligns the windowed edge of rclk and bclk. When sel rises, in addition to serving as a window signal for the phase comparator, it also causes the multiplexer to select rclk as the input to the delay line. Thus, when rclk rises, x falls, and bclk rises after the delay of the line. Because rclk rises before bclk, the low pulse on x and the high pulse on bclk are shortened compared to the other cycles. The result is that when the delay line is slow, every fourth pulse on bclk is shortened. Thus, no phase error accumulates from one rclk to the next.

If the delay line is very slow, rclk may go high before sel is asserted. In this case the up pulse will last the entire low-time of bclk. When sel switches the multiplexer to select an already high rclk, x goes high almost immediately. This results in a very short low pulse on x and a very short high pulse on bclk. More importantly, because this falling edge of bclk is caused by sel rising, not rclk rising, phase error does accumulate in this case. When the delay line is more than a half a bit clock slow, the bit clock will slip farther and farther behind rclk until it slips to the point where rclk is low. At this point the circuit sees rclk as being late and asserts down until rclk rises. The multiplying delay-locked loop will still converge from this state as long as the charge transferred by the one down pulse is smaller than the charge transferred by the series of up pulses. If necessary, convergence can be forced by inhibiting the first down pulse after a series of two or more up pulses.

One skilled in the art will understand that the frequency-multiplying DLL clock generator described here may be realized in many different ways. The circuit may have a different multiplication rate from that shown here or may have a programmable multiplication rate. The circuit may use a variety of delay elements including source-coupled logic elements, current-starved elements, and single-ended CMOS gates. The circuit may employ many different types of multiplexers including pass-gate multiplexers and static CMOS multiplexers. Different phase comparators can be employed including flip-flop and exclusive-OR phase comparators. Different types of charge pumps and other loop filters may be used in the circuit. Also, the control logic to control the multiplexer can be realized in a number of different ways including static CMOS logic, dynamic CMOS logic, and source-coupled FET logic.

Multi-Stage Multiplexer

Another problem with prior art data communication systems is that, at high multiplexing rates (e.g., 10:1), there is a high clock fan out, and hence a high clock load in both the data multiplexer and data demultiplexer. This high clock load leads to jitter in the output signal because it is difficult to fan out the clock signal to all of the loads with balanced delay. It also results in increased power dissipation.

The illustrated system divides the multiplexer into two or more stages. This reduces jitter by reducing the number of locations that the bit clock must be distributed with precise delay.

Prior art data communication systems using DLLs to generate timing signals typically generated a number of phases equal to the multiplication rate between the reference clock and the data rate. Distributing all of these clock phases with balanced delay is a challenging problem and mismatches in distribution usually account for considerable jitter in the system. For example, Dally and Poulton, "Transmitter Equalization for 4 Gb/s Signaling," *IEEE Micro*, January–February 1997, pp. 48–56, describes such a DLL-based data communication system which uses a 10-phase clock in the transmitter and a 20-phase clock in the receiver. Each of these 30-phases must be distributed to all of the clock loads with balanced delay. In this system, the 10:1 multiplexer is performed in a single stage. Even in systems where several stages of logic are used to implement such multiplexers, the multiplexing is logically done in a single stage. In such systems, the data is reduced from an N-wide bus at the reference clock rate to a single-bit line at N times the reference clock rate using a single set of precision timing signals.

The present invention of a low-jitter frequency-multiplying DLL enables the design of data communication systems that have the advantages of DLL timing circuits (no accumulation of jitter from one reference clock cycle to the next) and at the same time use high-frequency clocks. One use of such high-frequency clocks is to perform the multiplexing and demultiplexing in multiple stages. By operating the last stage of the multiplexer and the first stage of the demultiplexer at the highest possible frequency, the number of clock phases that must be distributed and the number of clock loads that require a precision clock are reduced. This results in lower overall system jitter.

Figure 12:
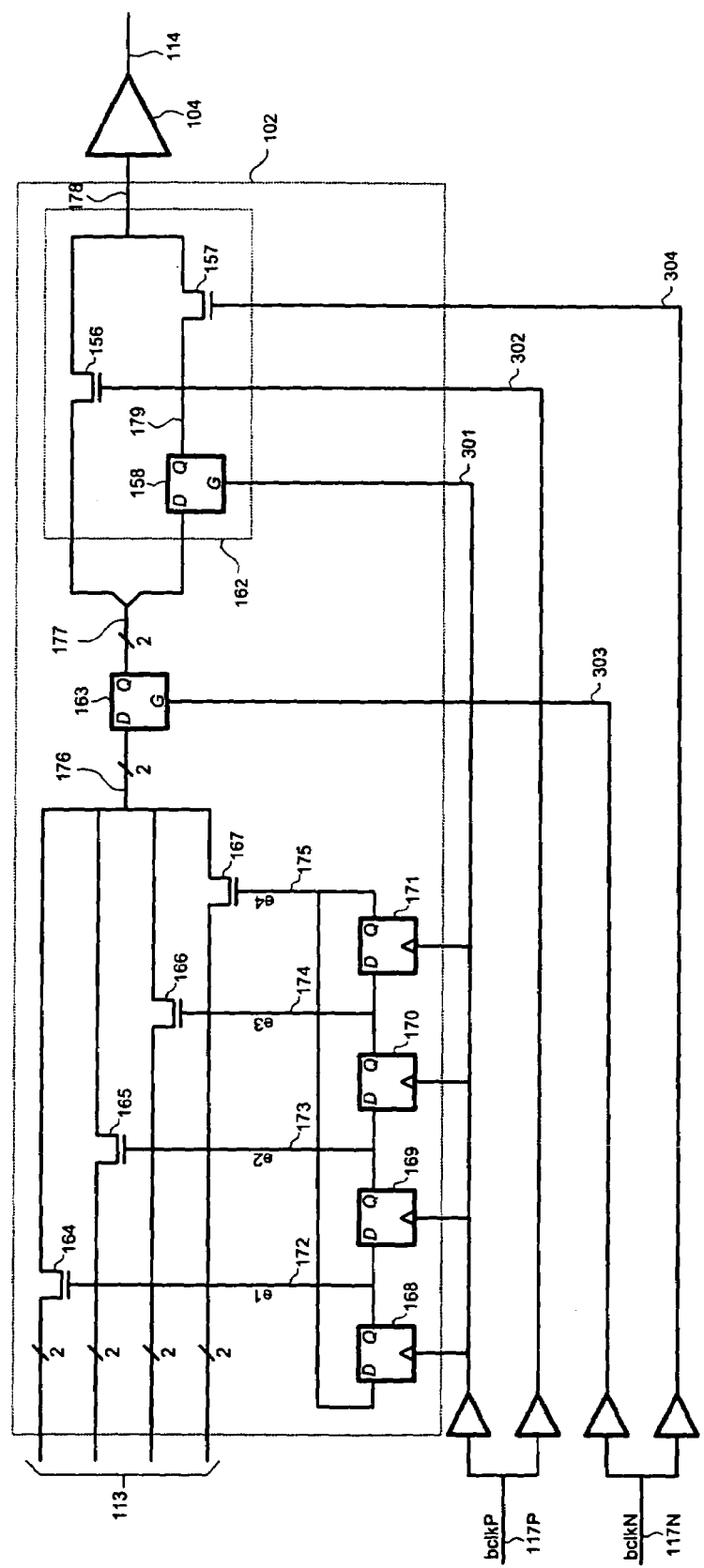
FIG. 12 illustrates a two stage data multiplexer which may be used as the multiplexer of FIG. 5.

A two-stage data multiplexer 102 of FIG. 5 is illustrated in FIG. 12. In the first stage, 8-bit input signal 113 is multiplexed in a 4:1 multiplexer to a 2-bit signal 176 at half-the bit rate. In the second stage, this intermediate 2-bit wide signal is multiplexed in a 2:1 multiplexer to generate the serial output signal 114.

This circuit has lower jitter than prior art one-stage multiplexers because the bit clock must only drive the two FETs 156 and 157 of the final multiplexer with balanced fan out. All other clock loads in this circuit are non-critical. In a prior art one-stage multiplexer, the bit clock must drive eight multiplexer loads with balanced fan out.

The multiplexer 102 operates off of a bit clock, bclk 117 that runs at half the bit rate. Two bits are transmitted on each cycle of bclk, one when bclk is high, and the second when bclk is low. Multiplexer 102 of FIG. 12 accepts an eight bit input on lines 113 and generates a single bit output on signal 178 which is amplified by transmitter 104 and driven onto transmission line 114. Multiplexer 102 is divided into two stages. The first stage is a two-bit-wide 4:1 multiplexer that reduces the eight-bit input down to two bits on signal 176. This stage need not have precise timing and thus can run off of a buffered version of bclk that need not be well controlled. The second stage of the multiplexer multiplexes two-bit signal 177 down to a single bit on multiplexer output 178.

A four-bit ring counter formed by flip-flops 168–171 sequences the first stage of the multiplexer. These flip-flops are initialized to state 1000 (e1=1 and e2=e3=e4=0) and the state rotates left on each rising edge of bclk. Thus during the first cycle, e1 172 is asserted causing FET 164 to turn on and in turn enabling the top two bits of input 113 onto signal 176. During the second cycle, the state is 0100 with e2 173 asserted, FET 165 on, and the second pair of bits from input 113 enabled onto output 176. During the third and fourth cycles, this pattern continues with the third and fourth pairs being enabled onto signal 176. The pattern then repeats starting over with e1 being asserted. During each cycle, the bit pair enabled onto signal 176 is captured in latch 163 which is gated by bclkN.

The clocking of flip-flops 168–171 that make up the ring counter which generates enables e1 through e3, and the clocking of latch 163 which samples the selected bit pair need not be very precise. As long as these clocks remain within a half-clock period centered about the optimum timing point, the output of latch 163 will remain stable during bclkP high when it is sampled by the second stage of the multiplexer. The relaxed timing of the clock to the first stage multiplexer allows a less precise buffered version of bclk to be used to drive the clock loads in this stage and simplifies the distribution of this clock.

The second stage of the multiplexer 162 is a 2:1 multiplexer controlled by the complementary phases of bclkP and bclkN and consisting of latch 158 and FETs 156 and 157. During the first half cycle (bclkP asserted), the high bit of signal 177 is enabled to output 178 via FET 156. At the same time, the low bit of signal 177 is sampled by latch 158 which holds this value to be output on the second half cycle. During the second half cycle (bclkN asserted), FET 157 enables the contents of latch 158, which holds the low bit of signal 177, to output 178. The relative timing of signals bclkP and bclkN and their distribution as low precision signals 301 and 303 through devices 252 and 253 is not critical. On the other hand, the relative timing of signals bclkP and bclkN and their distribution to FETs 156 and 157 as signals 302 and 304 through drivers 250 and 251 must be carefully controlled as any timing errors in the signals on the gates of these FETs translates directly to jitter on the output signal. However, this timing and distribution is relatively simple as the precision clock need only be distributed to two clock loads, FETs 156 and 157.

Figure 13:
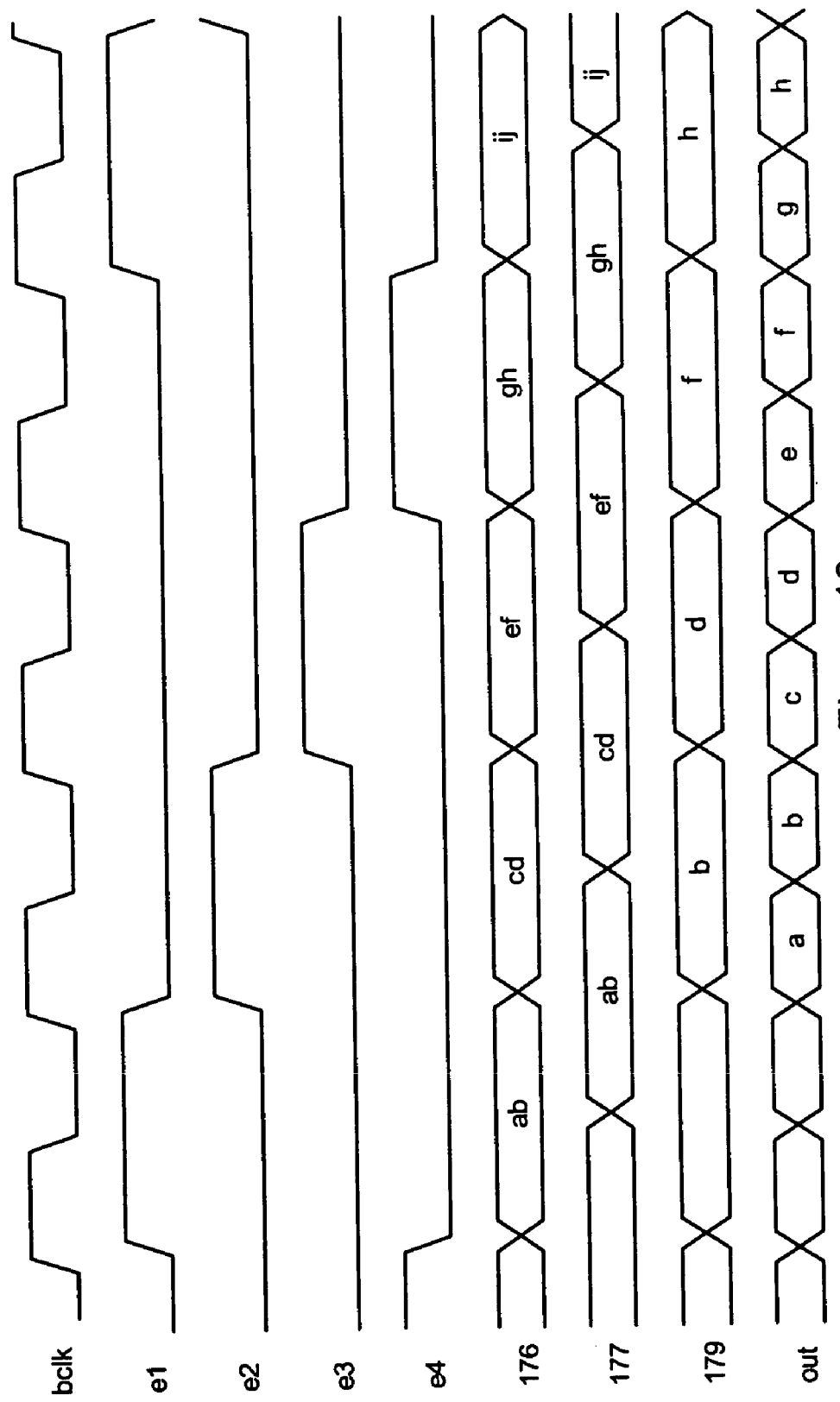
FIG. 13 presents waveforms showing the operation of the two stage multiplexer of FIG. 12.

Waveforms showing operation of the two-stage multiplexer are illustrated in FIG. 13. The top line of the figure shows half-bit-rate bit clock, bclk 113. The next four lines show the four enables, e1–e4 that drive the gates of the NFET pass gates 164–167 in the first stage of the multiplexer. Each enable goes high in sequence for one cycle of bclk. The sixth row of the figure shows the value on signal 176. When e1 is high, the first two bits, a and b, of input 113 are enabled onto 176. Next, when e2 is high, c and d are enabled onto 176, and so on. The seventh row of the figure shows the value on signal 177, the output of latch 163. Signal 177 carries the same values as signal 176 but delayed until the falling edge of bclk. Similarly, signal 179 on the eighth row of the figure has the same value as the low bit of signal 177 but further delayed until the rising edge of bclk. Finally, the last row of the figure shows the sequence of bits on the output line. When bclk is high, FET 156 enables the high bit of signal 177 onto the line 114. When bclk is low, FET 157 enables signal 179 onto the line 114.

With a multi-stage multiplexer, it is advantageous to keep the number of inputs to the final stage of multiplexing as small as possible because this minimizes the number of clock loads for the precision clock. A multi-stage multiplexer with a 2:1 second stage, as in FIG. 12, is preferred if the bit clock can be run at half the bit rate. This is feasible for data bit times down to three fan-out-of-four (FO4) inverter delays (a bit time of 400 ps or a bit rate of 2.5 GHz for a typical 0.25 $\mu$m CMOS process). At bit frequencies above this three FO4 limit, a larger multiplexing ratio in the second stage is required. For example, a 4:1 multiplexing rate can be used with bit times down to about 1.5 FO4 delays (200 ps or 5 GHz in 0.25 $\mu$m CMOS). Even with a 4:1 multiplexing rate, the advantage of the multi-stage multiplexer design is still realized. Distributing four precisely aligned clock phases is much simpler, and results in lower jitter, than distributing the 16- or 20- phases required by prior-art single-stage designs using a DLL operating at the reference frequency.

Figure 16:
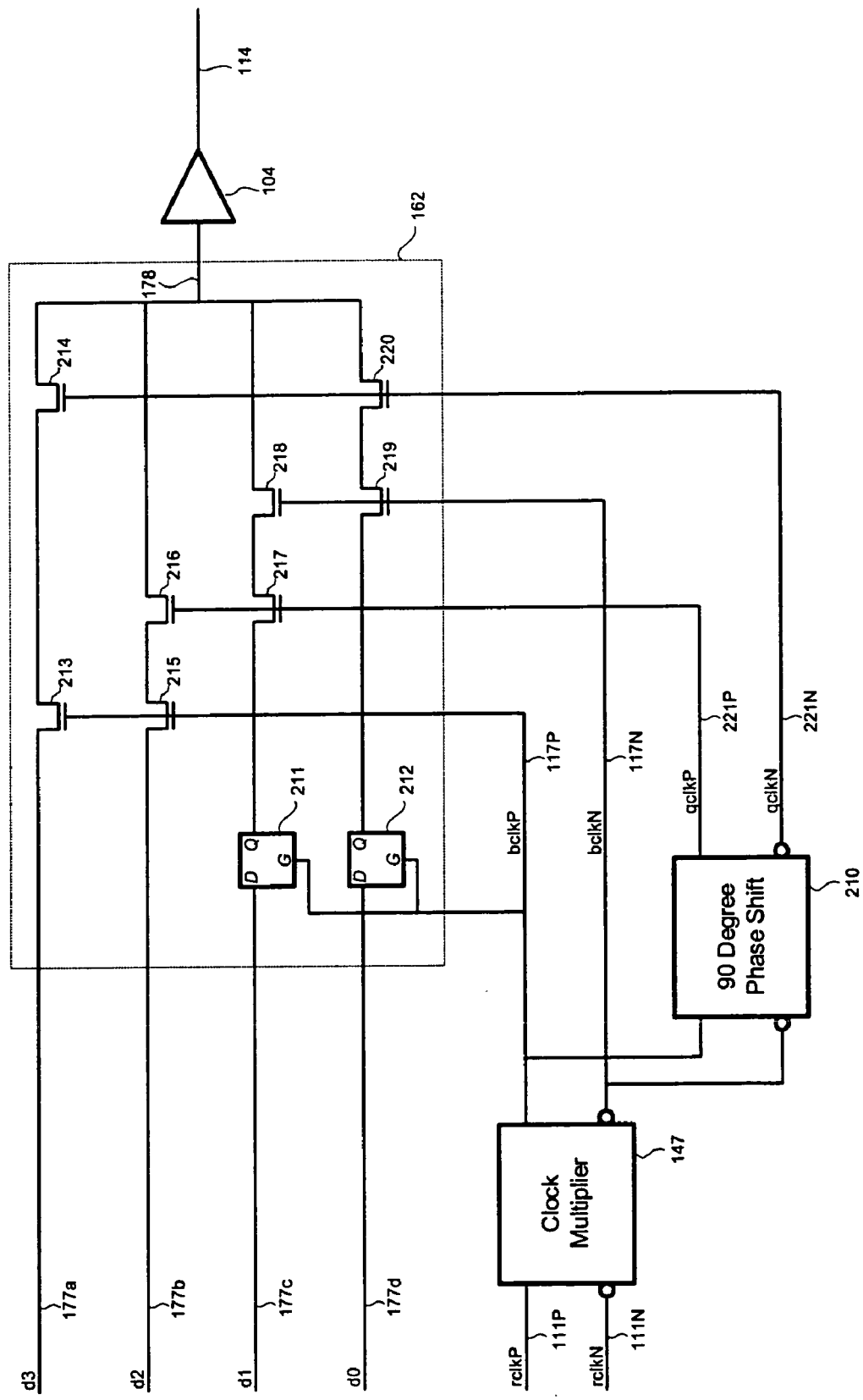
FIG. 16 illustrates an alternative second stage multiplexer that performs 4:1 multiplexing.

A block diagram of a second stage multiplexer 162 that performs 4:1 multiplexing from a quarter-bit-rate bit clock, bclk 117P and 117N, is shown in FIG. 16. This second-stage multiplexer can be combined with the first stage multiplexer of FIG. 12 with input bus 113 widened to 16-bits and intermediate buses 176 and 177 widened to four bits. The resultant two-stage multiplexer reduces 16 input bits to a single output bit in two 4:1 stages.

Figure 17:
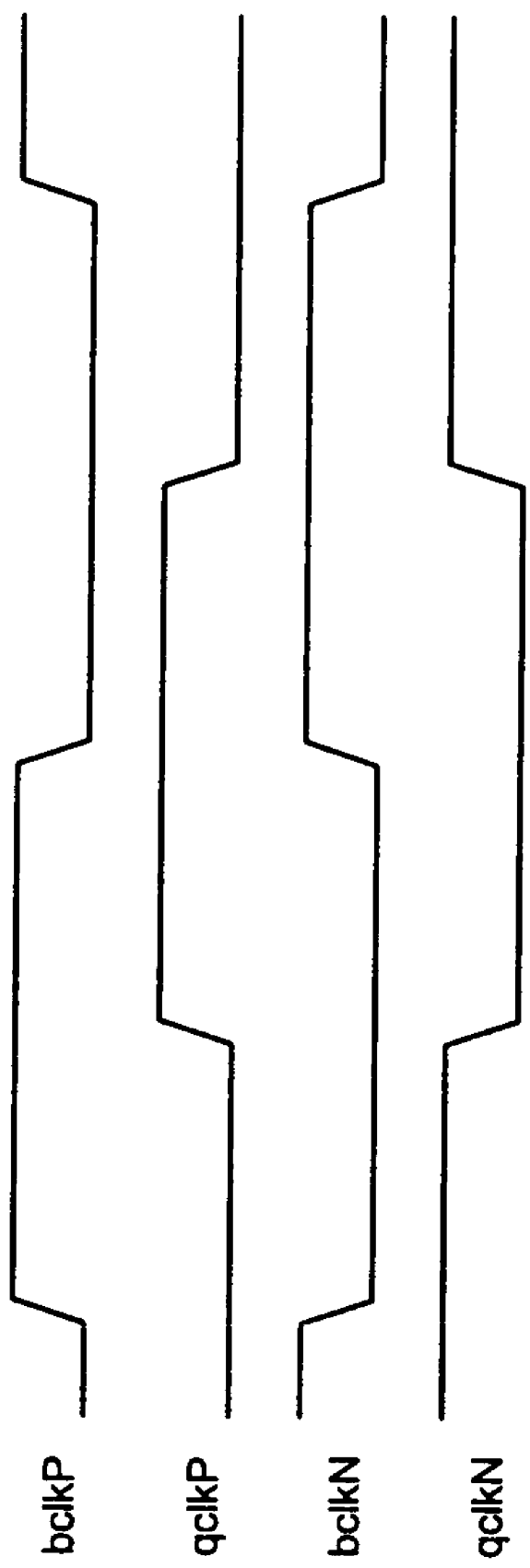
FIG. 17 illustrates the four phase overlapping clock signals used in FIG. 16.

The 4:1 multiplexer of FIG. 16 operates off a quarter bit-rate bit clock bclkP 117P and its complement bclkN 117N. To generate four phases without operating any signal at a frequency greater than a quarter of the bit rate, the bit clock is delayed by 90-degrees (one bit time) by phase shifter 210 to generate a quadrature bit clock, qclkP 221P, and its complement, qclkN 221N. The result is a four-phase overlapping clock as illustrated in FIG. 17.

Four bit data enters the 4:1 second-stage multiplexer of FIG. 16 on four-bit bus 177 (signals 177*a* to 177*d*). Each of these input signals is gated by two series NFETs that collectively are gated on during one quarter of the bclk cycle. For example, signal 177*a* is gated by FETs 213 and 214. FET 213 is gated by bclkP and FET 214 is gated by qclkN so that the series connection is only on during the first quarter of the clock cycle, when bclkP and qclkN are both high. Thus, signal 177*a*, the high bit of bus 177, is enabled to the output during the first quarter of the bclk cycle. Similarly, signal 177*b* is enabled onto the output during the second quarter of the bclk cycle by FETs 215 and 216 which are both on when bclkP and qclkP are both high. In a similar manner, signal 177*c* is enabled to the output during the third quarter of the cycle and signal 177*d* is enabled to the output during the last quarter of the cycle.

At very-high bit rates the bandwidth of multiplexer output signal 178 and output driver 104 become critical. These signals may toggle as frequently as every 1.5 FO4 delays. To improve the bandwidth of signal 178, the preferred embodiment adds a grounded PFET load resistor 254 to this node that limits the swing of this signal and boosts its bandwidth. The preferred embodiment also uses a source-coupled FET output driver 104 to realize adequate bandwidth.

One skilled in the art will understand that a multi-stage multiplexer can be realized in a number of different ways. There may be applications where it is advantageous to use more than two stages. Three or more stages may be appropriate at very high multiplexing rates. Different multiplexing rates may be used and a multiplexer may be constructed with a programmable rate. The enable signals for the first stage may be generated in different ways, for example using a counter. The pass-gate multiplexers shown in this design may be replaced by other types of multiplexers, for example static CMOS gate-based multiplexers. Also, the latches and flip-flops in these multiplexers may be replaced by other types of clocked storage elements.

Multi-Stage Demultiplexer

The timing of a demultiplexer can also be improved by splitting it into two or more stages. By operating the first stage with the lowest possible demultiplexing rate the number of precise clock phases that are required and the number of clock loads that must be driven with balanced delay are both minimized, just as with the multi-stage multiplexer. As with the multiplexer, the use of multi-stage demultiplexers in systems with DLL timing is enabled by the use of the frequency-multiplying DLL of the present invention.

Figure 14:
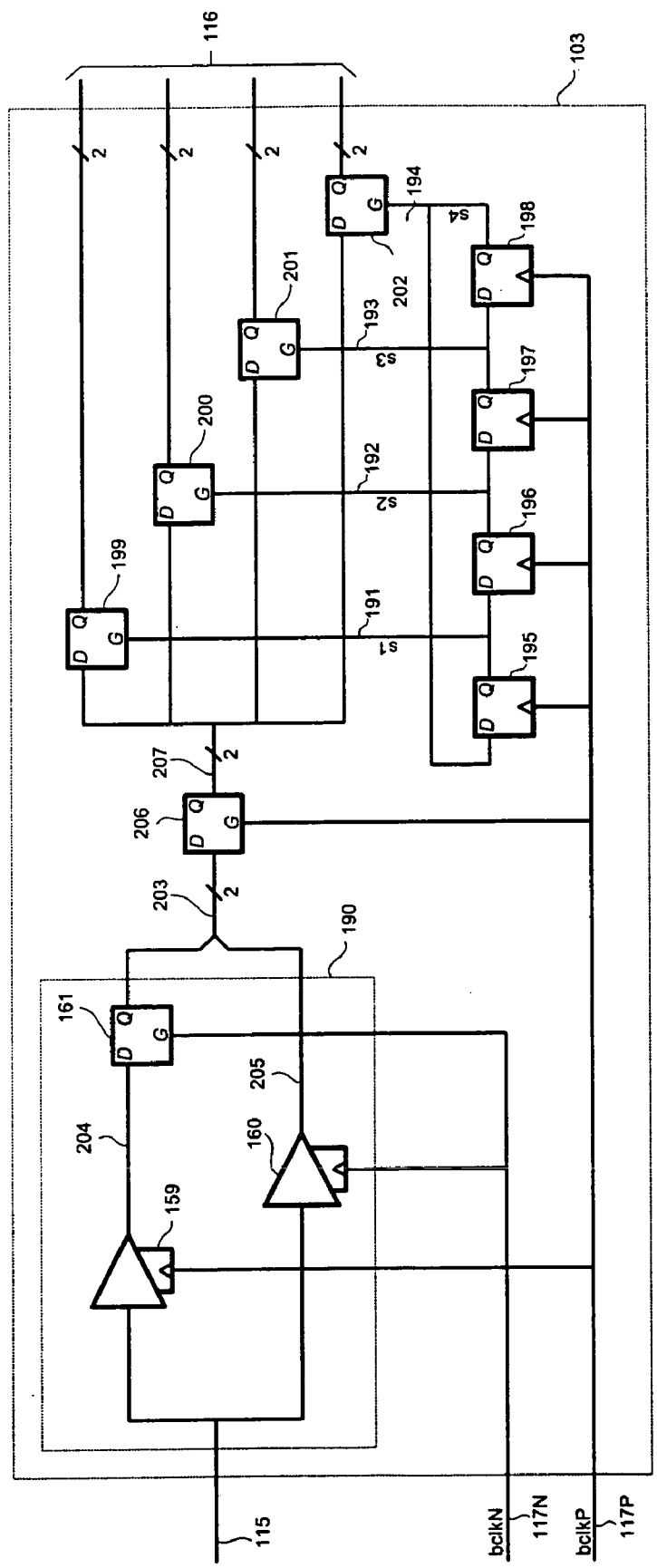
FIG. 14 illustrates a two stage demultiplexer for use in the circuit of FIG. 5.

A block diagram of a two-stage 1:8 demultiplexer is shown in FIG. 14. This demultiplexer consists of a 1:2 first stage 190 followed by a two-bit-wide 1:4 second stage. The first stage consists of two clocked receive amplifiers 159 and 160 and latch 161. Amplifier 159 samples the data on input line 115 on each rising edge of bclk, detecting the even bits. In a similar manner, amplifier 160 detects the odd bits, sampling the data on line 115 on each falling edge of blk. Latch 161 delays the rising edge sample from amplifier 159 to align it with the output of amplifier 160 on the falling edge of bclk.

Data enters the second stage of the multiplexer on two-bit line 203. This data is aligned with the rising edge of bclk by two-bit latch 206. Signal 207 on the output of this latch is then distributed to four two-bit wide latches 199–204 that are gated by strobes s1–s4 191–194. The strobes are generated by a ring counter formed by flip-flops 195–198 in a manner similar to that used in the multiplexer. The four strobes sample two-bit values from signal 207 into the four latches in sequence. Strobe s1 samples the first two bits into latch 199 on the first bclk. On the next clock, strobe s2 samples the second two bits into latch 200, and so on. The outputs of this multiplexer are each valid for one reference clock time, but staggered across the four pairs. A latch gated with s4 may be used to align the four output pairs.

Figure 15:
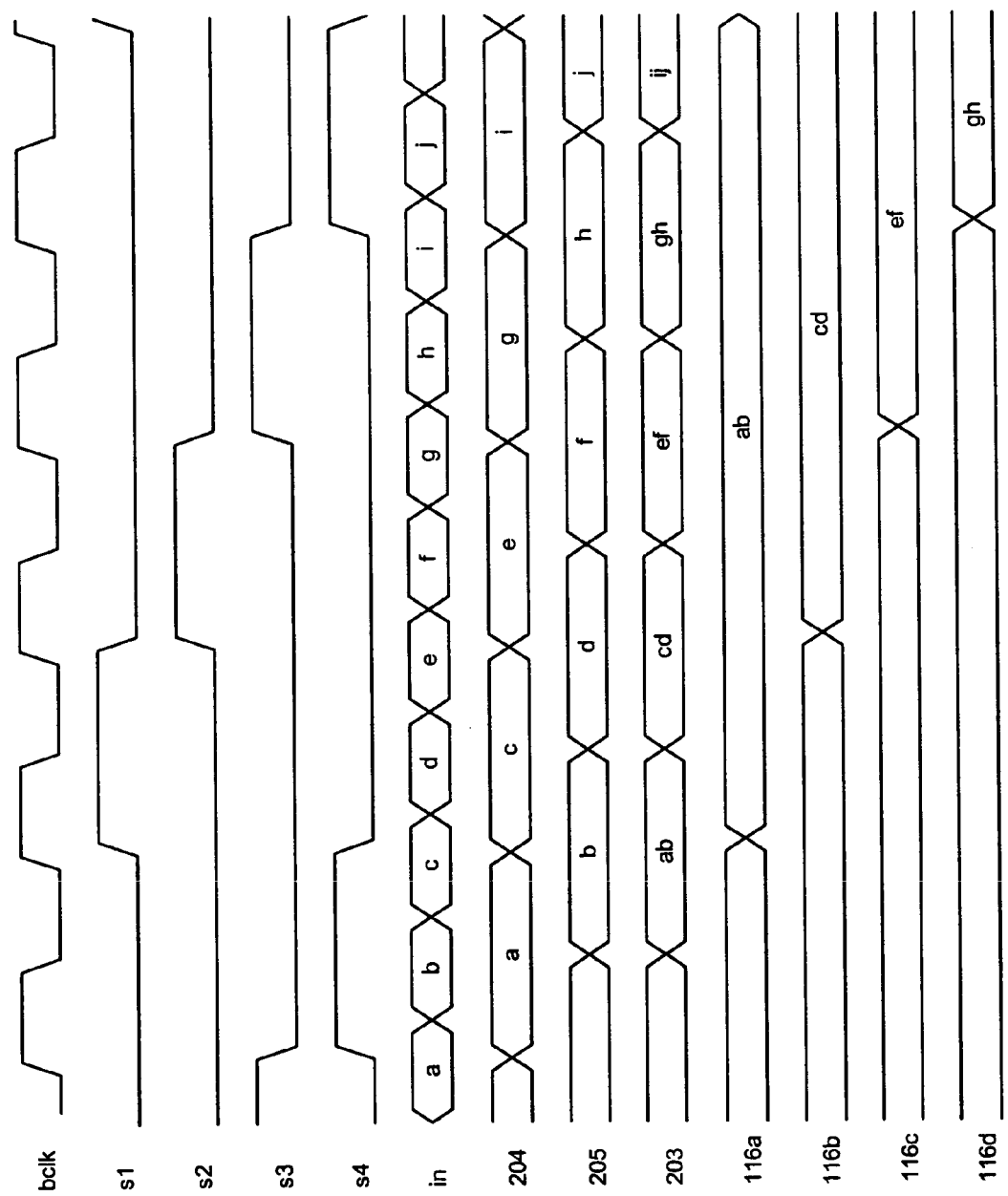
FIG. 15 presents waveforms showing the operation of the two stage demultiplexer of FIG. 14.

Waveforms showing the operation of the two-stage demultiplexer are shown in FIG. 15. The first five rows show the key timing signals. The top row shows the half-bit-rate bit clock, bclk, and the next four rows show the four data strobes s1 through s4. As with the enables in FIG. 13, each strobe is high for one bclk cycle in sequence. The sixth row of the figure shows the input signal 115. The output of amplifier 159, signal 204 shown on the seventh row of the figure, is the value on the line sampled on each rising edge of bclk. Similarly the eighth row of the figure shows signal 205, the output of amplifier 160, which is the input signal sampled on the falling edge of bclk. The next row shows these two signals aligned and combined on signal 203. The final four rows show the output signals on lines 116a through 116d each of which is valid for a rclk period, but staggered. Sampling these four rows with s4 generates an aligned eight-bit-wide signal.

As with last-stage multiplexers, first-stage demultiplexers must operate off of a clock with a period of at least 6 FO4 delays. Thus, with bit periods shorter than 3 FO4 delays the 1:2 first-stage demultiplexer operating off of a half-bit-rate clock cannot keep up. The advantages of multi-stage demultiplexers can still be realized in this case by operating with a clock at a smaller fraction of the bit rate and a corresponding higher degree of demultiplexing. Such a design still has fewer critical clock phases and critical clock loads than conventional DLL-based demultiplexers that use a number of phases equal to the multiplication rate between the reference clock and the bit rate.

Figure 18:
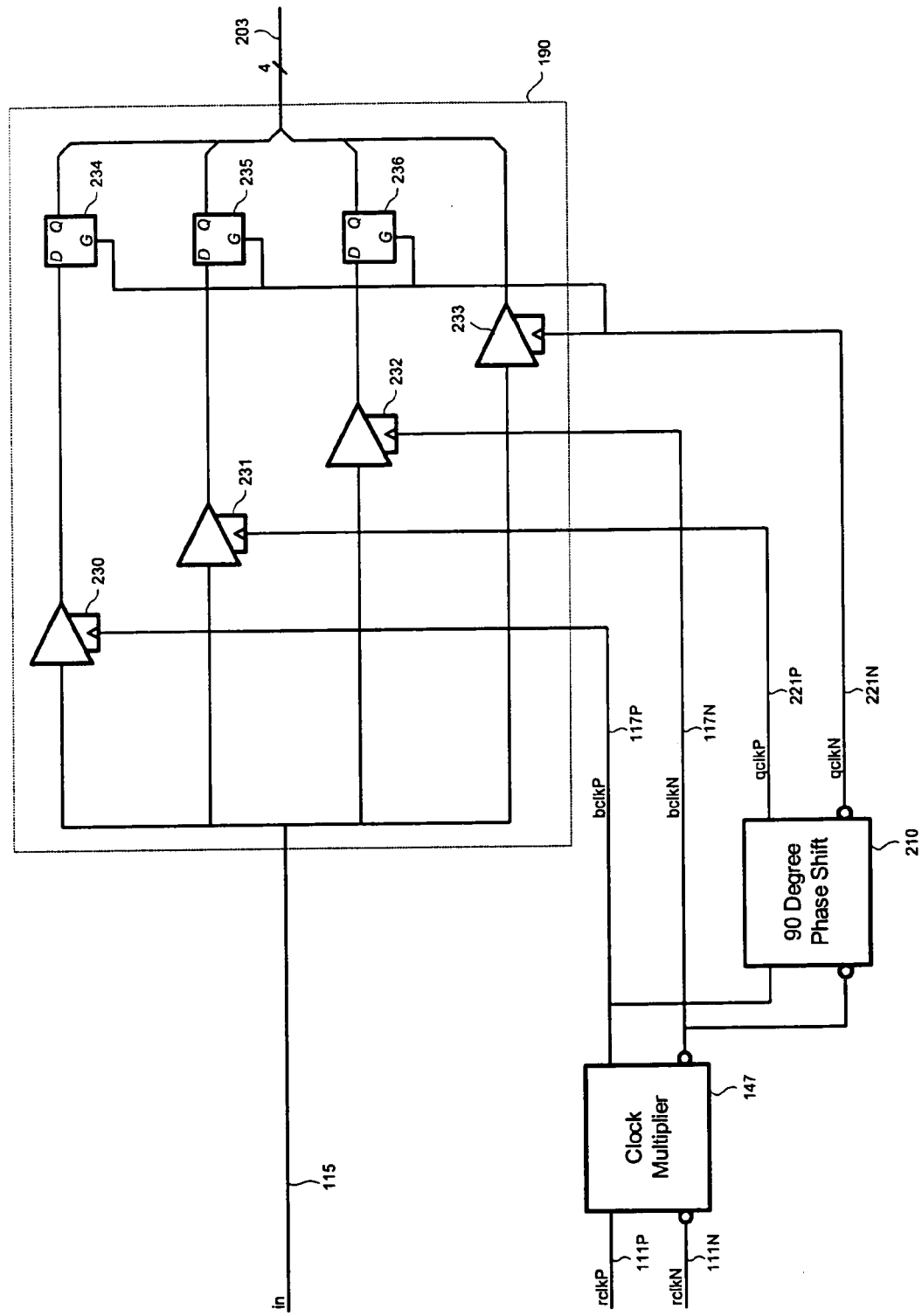
FIG. 18 illustrates a first stage demultiplexer with a 1:4 demultiplexing rate.

A first-stage demultiplexer 190 with a 1:4 demultiplexing rate is shown in FIG. 18. This demultiplexer is sequenced by the four-phase quadrature clock shown in FIG. 17. As with the 4:1 demultiplexer, this clock is generated by a frequency-multiplying DLL 147 that generates a quarter-bit-rate bit clock, bclk 117, and a 90-degree (one bit time) phase shifter that generates a quarter-bit-rate quadrature clock, qclk 221. The four phases of the quadrature clock directly sample bits off of the line into the four clocked receive amplifiers 230–233. During each four-bit period, the first bit is sampled by bclkP into amplifier 230, the second bit by qclkP into amplifier 231, the third bit by bclkN into amplifier 232, and the fourth bit by qclkN into amplifier 233. Latches 234–236 delay the first three bits to align them with the fourth bit on the falling edge of qclk. The aligned four-bit output is presented on signal 203.

This 1:4 first-stage demultiplexer is intended to be used in conjunction with a second-stage demultiplexer such as the second stage of the two-stage demultiplexer of FIG. 14. To adapt the second stage of FIG. 14 for the 1:4 front end, buses 203 and 207 must be widened to four bits and parallel output 116 must be widened to 16 bits.

One skilled in the art will understand that a multi-stage demultiplexer can be realized in a number of different ways. The number of stages may be greater than two, and each stage may have a different demultiplexing rate or a programmable demultiplexing rate. The first stage may employ separate amplifiers and flip-flops rather than combined clocked receive amplifiers. Different circuits may be used to generate the strobes for the second stage of the demultiplexer. Also, the latches and flip-flops in the demultiplexer may be replaced by other types of clocked storage elements.

While this invention has been particularly shown and described with references to preferred embodiments thereof, it will be understood by those skilled in the art that various changes in form and details may be made therein without departing from the scope of the invention encompassed by the appended claims.

What is claimed is:

1. A clock multiplier comprising:
   a delay line which provides a multiplied clock having a frequency greater than a reference clock;
   a clock multiplexer which applies as an input to the delay line, at respective times, the multiplied clock and the reference clock; and
   a delay adjustment circuit including a proportional phase comparator which adjusts delay in the delay line based on a direct phase comparison of the reference clock and of the multiplied clock.

2. A clock multiplier as claimed in claim 1 in which the phase comparator has a phase offset of less than five percent of a bit time.

3. A clock multiplier as claimed in claim 1 in which the phase comparator has a phase offset of less than ten percent of a gate rime.

4. A clock multiplier as claimed in claim 1 wherein the delay adjustment circuit includes a combined phase comparator and charge pump.

5. A data communications circuit comprising:
   a data multiplexing circuit for multiplexing data on a transmission medium; and
   a clock multiplier comprising:
      a delay line which provides a multiplied clock, having a frequency greater than a reference clock, which is applied back to the input of the delay line; and
      a delay adjustment circuit including a phase comparator which adjusts delay in the delay line based on a direct phase comparison of the reference clock and the multiplied clock.

6. A data communications circuit as claimed in claim 5 wherein the clock multiplier further comprises a clock multiplexer which applies as an input to the delay line, at respective times, the multiplied clock and the reference clock.

7. The data communications circuit of claim 6 wherein the phase comparator is a proportional phase comparator.

8. A communications circuit as claimed in claim 7 wherein the phase comparator has an offset of less than five percent of a bit time.

9. A communications circuit as claimed in claim 7 in which the phase comparator has a phase offset of less than ten percent of a gate time.

10. A data communication circuit as claimed in claim 7 wherein the delay adjustment circuit includes a combined phase comparator and charge pump.

11. A data communications circuit as claimed in claim 5 which is a data transmitter, the data multiplexing circuit being a data multiplexer.

12. A data communications circuit as claimed in claim 5 which is a receiver, the data multiplexing circuit being a data demultiplexer.

13. A data communications circuit as claimed in claim 5 which is a transceiver and comprising a first multiplexing circuit which is a data multiplexer and a second data multiplexing circuit which is a data demultiplexer.

14. A method of generating a multiplied clock comprising:
   applying a reference clock through a clock multiplexer to a delay line;
   applying a multiplied clock, having a frequency greater than the reference clock, from the delay line through the clock multiplexer to the input of the delay line; and
   in a proportional phase comparator, directly comparing the phase of the reference clock and the multiplied clock; and
   adjusting the delay of the delay line based on the phase comparison.

15. A method as claimed in claim 14 wherein the phase comparison has a phase offset of less than five percent of a bit time.

16. A method as claimed in claim 14 as claimed in claim 1 in which the phase comparator has a phase offset of less than ten percent of a gate time.

17. A method as claimed in claim 14 wherein the delay of the delay line is adjusted in a delay adjustment circuit including a combined phase comparator and charge pump.

18. A method of communicating data comprising:
   applying a delay line output to an input of the delay line to provide a multiplied clock;
   directly comparing the phase of the multiplied clock with a reference clock;
   adjusting the delay of the delay line based on the phase comparison; and
   applying the multiplied clock to a data multiplexing circuit for multiplexing data on a transmission medium.

19. A method as claimed in claim 18 wherein the delay line output is applied to the input of the delay line through a clock multiplexer which applies as an input to the delay line, at respective times, the multiplied clock and reference clock.

20. A method as claimed in claim 19 wherein the phase of the multiplied clock is compared with the reference clock in a proportional phase comparator.

21. A method as claimed in claim 20 wherein the phase comparator has an offset of less than five percent of a bit time.

22. A method as claimed in claim 20 in which the phase comparator has a phase offset of less than ten percent of a gate time.

23. A method as claimed in claim 20 wherein the phase comparator is included in a combined phase comparator and charge pump.

24. A method as claimed in claim 18 wherein the multiplexing circuit is a data multiplexer for transmitting data to the transmission medium.

25. A method as claimed in claim 18 wherein the data multiplexing circuit is a data demultiplexer which receives data from a transmission medium.

26. A method as claimed in claim 18 wherein the data multiplexing circuit is a transceiver including a data multiplexer in a data transmitter and a data demultiplexer in a data receiver.

27. A data communications data transmitter circuit comprising:
   a data multiplexer for multiplexing data on a transmission medium; and
   a clock multiplier comprising:
      a delay line which provides a multiplied clock which is applied back to the input of the delay line; and
      a delay adjustment circuit including a phase comparator which adjusts delay in the delay line based on a direct phase comparison of a reference clock and the multiplied clock.

28. A data communications receiver circuit comprising:
   a data demultiplexer for demultiplexing data from a transmission medium; and
   a clock multiplier comprising:
      a delay line which provides a multiplied clock which is applied back to the input of the delay line; and
      a delay adjustment circuit including a phase comparator which adjusts delay in the delay line based on a direct phase comparison of a reference clock and the multiplied clock.

29. A data communications transceiver circuit comprising:
   a data multiplexer and a data demultiplexer for multiplexing data on a transmission medium; and
   a clock multiplier comprising:
      a delay line which provides a multiplied clock which is applied back to the input of the delay line; and
      a delay adjustment circuit including a phase comparator which adjusts delay in the delay line based on a direct phase comparison of a reference clock and the multiplied clock.

* * * * *

UNITED STATES PATENT AND TRADEMARK OFFICE
CERTIFICATE OF CORRECTION

PATENT NO. : 6,952,431 B1
DATED : October 4, 2005
INVENTOR(S) : William J. Dally and John W. Poultom It is certified that error appears in the above-identified patent and that said Letters Patent is hereby corrected as shown below:

Column 12,
Line 67, delete "rime" and insert -- time --.

Column 13,
Line 28, delete "communication" and insert -- communications --.

Signed and Sealed this

Tenth Day of January, 2006

JON W. DUDAS
*Director of the United States Patent and Trademark Office*